(12) United States Patent
Weber et al.

(10) Patent No.: US 12,490,485 B2
(45) Date of Patent: Dec. 2, 2025

(54) SUPERJUNCTION TRANSISTOR DEVICE

(71) Applicant: Infineon Technologies Austria AG, Villach (AT)

(72) Inventors: Hans Weber, Bayerisch Gmain (DE); Björn Fischer, Munich (DE); Franz Hirler, Isen (DE); Matteo-Alessandro Kutschak, Ludmannsdorf (AT); Andreas Riegler, Lichtpold (AT)

(73) Assignee: Infineon Technologies Austria AG, Villach (AT)

( * ) Notice: Subject to any disclaimer, the term of this patent is extended or adjusted under 35 U.S.C. 154(b) by 540 days.

(21) Appl. No.: 17/792,447

(22) PCT Filed: Jan. 19, 2021

(86) PCT No.: PCT/EP2021/051023
§ 371 (c)(1),
(2) Date: Jul. 13, 2022

(87) PCT Pub. No.: WO2021/148383
PCT Pub. Date: Jul. 29, 2021

(65) Prior Publication Data
US 2023/0126534 A1    Apr. 27, 2023

(30) Foreign Application Priority Data

Jan. 20, 2020  (WO) ............... PCT/EP2020/051245
Sep. 7, 2020  (EP) ................................ 20194876

(51) Int. Cl.
*H10D 62/17*    (2025.01)
*H03K 17/687*    (2006.01)
(Continued)

(52) U.S. Cl.
CPC ......... *H10D 62/307* (2025.01); *H03K 17/687* (2013.01); *H10D 30/668* (2025.01);
(Continued)

(58) Field of Classification Search
CPC .. H10D 62/307; H10D 62/314; H10D 30/668; H10D 64/117; H10D 64/513;
(Continued)

(56) References Cited

U.S. PATENT DOCUMENTS 10,204,993 B2    2/2019  Hirler
2008/0230833 A1*  9/2008  Zundel ............... H10D 30/663
                                         438/270
(Continued)

FOREIGN PATENT DOCUMENTS

CN    208570614 U  *  3/2019  ......... H01L 29/0634

*Primary Examiner* — Joseph C. Nicely
(74) *Attorney, Agent, or Firm* — Murphy, Bilak & Homiller, PLLC

(57) ABSTRACT

A transistor device is disclosed. The transistor device includes: a semiconductor body (100); a drift region (11) in the semiconductor body (100); a plurality of transistor cells (10); and a gate node (G) and a source node (S), wherein each of the plurality of transistor cells (10) includes: a first trench electrode (21) insulated from the semiconductor body (100) by a first dielectric layer (22); a second trench electrode (23) insulated from the semiconductor body (100) by a second dielectric layer (24); a source region (13) and a body region (14) in a first mesa region (111) between the first trench electrode (21) and the second trench electrode (23); and a compensation region (12), wherein the compensation region (12) adjoins the body region (14), the first dielectric (22), the second dielectric (24), and forms a pn-junction with the drift region (11), and wherein from the first trench electrode (21) and the second trench electrode (23) at least the first trench electrode (21) is connected to the gate node (G).

14 Claims, 16 Drawing Sheets

(51) Int. Cl.
*H10D 30/66* (2025.01)
*H10D 64/00* (2025.01)
*H10D 64/27* (2025.01)
*H10D 84/00* (2025.01)

(52) U.S. Cl.
CPC ......... *H10D 64/117* (2025.01); *H10D 64/513* (2025.01); *H10D 84/143* (2025.01); *H10D 84/146* (2025.01)

(58) Field of Classification Search
CPC ............... H01L 29/1045; H01L 29/105; H01L 29/7813; H01L 29/407; H01L 29/4236
See application file for complete search history.

(56) References Cited

U.S. PATENT DOCUMENTS

| | | | |
|---|---|---|---|
| 2010/0096692 A1* | 4/2010 | Saito | H10D 62/111 257/330 |
| 2011/0169103 A1* | 7/2011 | Darwish | H10D 62/158 257/E29.262 |
| 2012/0305993 A1* | 12/2012 | Willmeroth | H10D 84/87 257/E27.06 |
| 2012/0306464 A1* | 12/2012 | Hirler | H03K 17/04123 327/434 |
| 2015/0091641 A1* | 4/2015 | Mauder | H10D 30/668 327/566 |
| 2016/0006353 A1 | 1/2016 | Hirler et al. | |
| 2016/0343849 A1* | 11/2016 | Darwish | H10D 30/63 |
| 2018/0019310 A1* | 1/2018 | Hirler | H10D 64/117 |
| 2020/0287535 A1* | 9/2020 | Weber | H03K 17/06 |

\* cited by examiner

SUPERJUNCTION TRANSISTOR DEVICE

This disclosure relates in general to a superjunction transistor device.

A superjunction transistor device usually includes a plurality of pn-junctions between one or more drift regions and a plurality of compensation regions, and a control structure with one or more gate electrodes. The control structure is configured to control an operating state of the transistor device.

There is a need for an improved superjunction transistor device.

One example relates to a transistor device. The transistor device includes a semiconductor body, a drift region in the semiconductor body, a plurality of transistor cells, a gate node and a source node. Each of the plurality of transistor cells includes a first trench electrode insulated from the semiconductor body by a first dielectric layer, a second trench electrode insulated from the semiconductor body by a second dielectric layer, a source region and a body region in a first mesa region between the first trench electrode and the second trench electrode, and a compensation region. The compensation region adjoins the body region, the first dielectric layer and the second dielectric layer, and forms a pn-junction with the drift region. From the first trench electrode and the second trench electrode at least the first trench electrode is connected to the gate node.

Examples are explained below with reference to the drawings. The drawings serve to illustrate certain principles, so that only aspects necessary for understanding these principles are illustrated. The drawings are not to scale. In the drawings the same reference characters denote like features.

FIG. 1 schematically illustrates a vertical cross sectional view of one section of a superjunction transistor device with a plurality of transistor cells, according to one example;

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
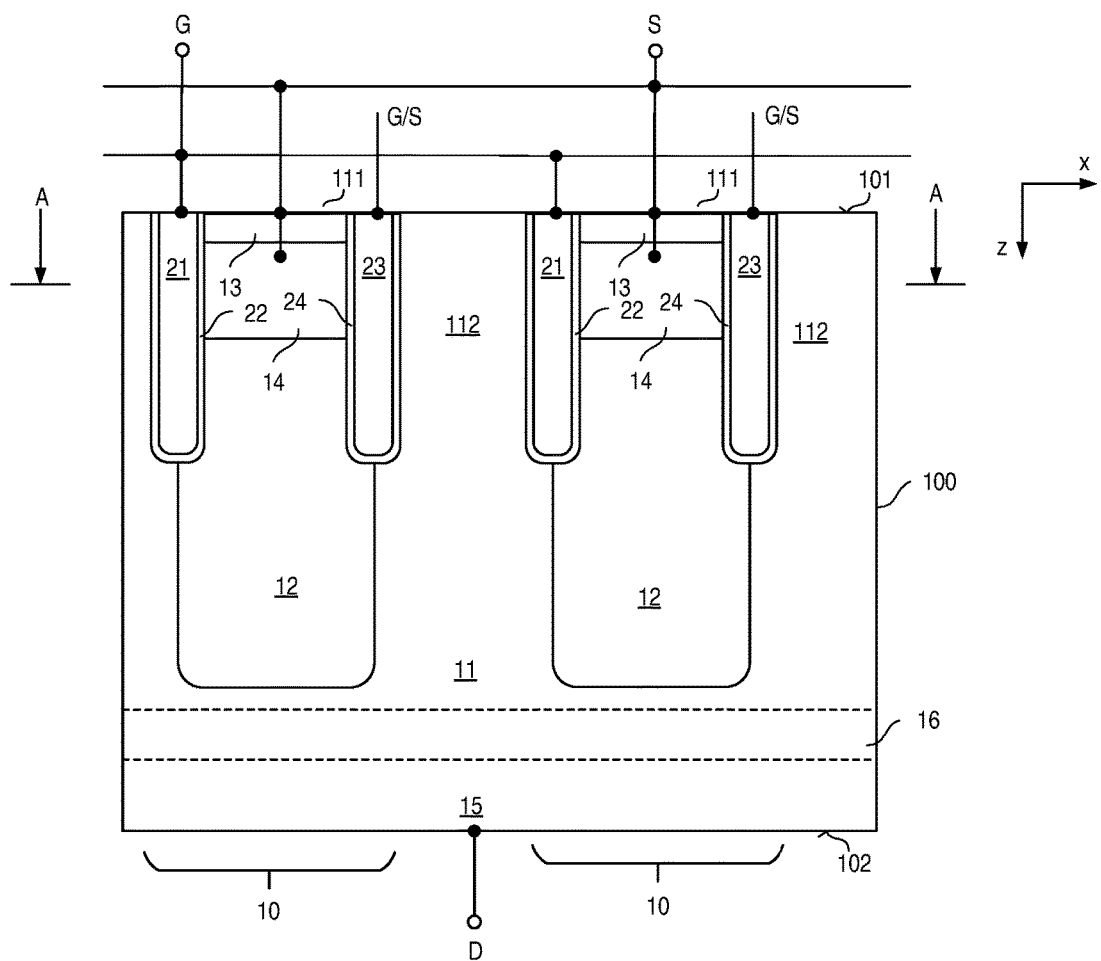

FIG. 1 shows a vertical cross sectional view of one section of a superjunction transistor device. More specifically, FIG. 1 shows a vertical cross sectional view of a semiconductor body 100 in which active regions of the superjunction transistor device are integrated. The semiconductor body 100 has a first surface 101, which may also be referred to as first main surface. FIG. 1 shows the semiconductor body 100 in a vertical section plane, wherein this vertical section plane is essentially perpendicular to the first surface 101. The semiconductor body 100 may include a conventional semiconductor material, such as, for example, silicon (Si), silicon carbide (SiC), gallium nitride (GaN), gallium arsenide (GaAs), or the like.

Referring to FIG. 1, the transistor device includes a drift region 11 of a first doping type (conductivity type) and a plurality of transistor cells 10, wherein in FIG. 1 two of the transistor cells 10 are illustrated. Each of these transistor cells 10 includes two trench electrodes, a first trench electrode 21, and a second trench electrode 23. The first trench electrode 21 is arranged in a first trench and is dielectrically insulated from the semiconductor body 100 by a first dielectric layer 22, which is briefly referred to as first dielectric in the following. The second trench electrode 23 is arranged in a second trench and is dielectrically insulated from the semiconductor body 100 by a second dielectric layer 24, which is briefly referred to as second dielectric in the following. Each of the first trench and the second trench extends from the first surface 101 into the semiconductor body 100.

The first trench electrode 21 and the second trench electrode 23 are spaced apart from each other in a first lateral direction x, wherein the first lateral direction x is essentially parallel to the first surface 101 of the semiconductor body 100. A region of the semiconductor body 100 between the first trench and the second trench is referred to as first mesa region 111 in the following.

Each transistor cell 10 further includes a compensation region 12 of the second doping type (conductivity type), a source region 13 of a second doping type complementary to the first doping type, and a body region 14 of the second doping type. The source region 13 and the body region 14 are arranged between the first trench and the second trench, that is, each of the source region 13 and the body region 14 is arranged in the first mesa region 111. The body region 14 is arranged between the source region 13 and the compensation region 12 and separates the source region 13 from the compensation region 12. According to one example, the body region 14, adjoins both the first dielectric 22 and the second dielectric 24, and the source region 12 adjoins both the first dielectric 22 and the second dielectric 24.

Furthermore, the compensation region 12 adjoins the body region 14. One portion of the compensation region 12 is arranged in the first mesa region 111, that is, between the first and second trench and adjoins the first and second trench. A further portion of the compensation region 12, in a vertical direction z of the semiconductor body 100, extends beyond bottoms of the first and second trenches towards a second surface 102 of the semiconductor body 100 and adjoins the at least one drift region 11 so that a pn junction is formed between the compensation region 12 and the drift region 11. The "vertical direction" z of the semiconductor body 100 is a direction perpendicular to the first surface 101 of the semiconductor body 100. The second surface 102 of the second semiconductor is opposite the first surface 101 and is spaced apart from the first surface 101 in the vertical direction z of the semiconductor body 100.

Referring to FIG. 1, the first and second trenches are spaced apart from the second surface 102 and both the drift region 11 and the compensation regions 12 extend beyond bottoms of the trenches towards the second surface 102. According to one example, a vertical dimension of the compensation regions 12 below the trench bottoms is at least 80%, at least 90%, or at least 95% of a vertical dimension of the drift region 11 below the trench bottoms.

The drift region 11 of the transistor device is connected to a drain node D. According to one example, the transistor device further includes a drain region 15 (illustrated in dashed line) of the first doping type, wherein the drain region 15 is either connected to the drain node D or forms the drain node D of the transistor device. A doping concentration of the drain region 15 is higher than a doping concentration of the drift region 11. The drift region 11 may adjoin the drain region 15. According to another example, a buffer region 16 of the first doping type is arranged between the drift region 11 and the drain region 15, wherein the buffer region 16 has a doping concentration that is different from the doping concentration of the drift region 11 and lower than a doping concentration of the drain region 15. According to one example, the doping concentration of the buffer region 16 is lower than the doping concentration of the drift region 11. The buffer region 16 can be spaced apart from the compensation regions 12 (as illustrated), so that a section of the drift region 11 is arranged between the compensation regions 12 and the buffer region 16, or the buffer region 16 may adjoin the compensation regions 12 (not illustrated). In the first example, the drift region 11 is a continuous semiconductor region that adjoins each of the plurality of compensation regions 12. In the second example, the drift region 11 includes a plurality of drift region sections, wherein each of these drift region sections may be arranged between two compensation regions 12.

From the first trench electrode 21 and the second trench electrode 23 of each transistor cell 10 at least the first trench electrode 21 is connected to the gate node G. The source regions 13 and the body regions 14 of the transistor cells are connected to the source node S. The second trench electrode 23 is connected to the gate node G, is connected to the source node S, or is floating. This is explained in detail herein further below.

The transistor device can be implemented as an n-type transistor device or as a p-type transistor device. In an n-type transistor device, the drift region 11, the source regions 13, the optional drain region 15 and the optional buffer region 16 are n-type (n-doped) regions and the compensation regions 12 and the body regions 14 are p-type (p-doped) regions. In a p-type transistor device, the doping types of the individual active device regions 11-16 are complementary to the doping types in an n-type transistor device.

According to one example, the semiconductor body 100 includes monocrystalline silicon and the individual active device regions are implemented such that a respective doping concentration is in a range as outlined in the following:

drift region 11: between 1E15 cm$^{-3}$ and 1E17 cm$^{-3}$;
compensation region 12: between 1E15 cm$^{-3}$ and 1E17 cm$^{-3}$;
source region 13: between 1E18 cm$^{-3}$ and 1E21 cm$^{-3}$;
body region 14: between 1E17 cm$^{-3}$ and 1E18 cm$^{-3}$;
drain region 15: between 1E18 cm-3 and 1E21 cm-3;
optional buffer region 16: between 5E14 cm-3 and 1E17 cm-3, wherein the buffer region 16 may include two or more differently doped sub-regions (not shown) arranged one above the other in the vertical direction z.

The superjunction transistor device, which may also be referred to as superjunction MOSFET, can be operated in the same way as a conventional superjunction transistor device. The transistor device conducts a current between the drain node D and the source node S when a voltage (drain-source voltage) is applied between a drain node D and the source node S that forward biases the pn junction between the compensation regions 12 of the transistor cells 10 and the drift region 11. In an n-type transistor device, the pn junction between the compensation regions 12 and the drift region 11 is forward biases when a positive voltage is applied to the source node S in relation to the drain node D. In this case, a current flows from the source node S via the body region 14 and the compensation region 12 of each transistor cell 10, and the drift region 11 to the drain node D. An operating state of the transistor device in which the pn junctions between the compensation regions 12 and the drift region 11 are forward biased so that a current flows between the source node S and the drain node D is referred to as reverse biased state or reverse conducting state in the following.

When a voltage is applied between the drain node D and the source node S that reverse biases the pn junctions between the drift region 11 and the compensation regions 12 the transistor device can be switched on or switched off by applying a suitable voltage (gate-source voltage) between the gate node G and the source node S. The transistor device is in the on-state, when the gate-source voltage is such that a conducting channel is generated by field-effect in the body region 14 and the compensation region 12 along the first dielectric 22, so that a current can flow between the source region 13 and the drift region 11 via this conducting channel along the first dielectric 22.

The transistor device is in the off-state, when the conducting channel in the body region 14 and the compensation region 12 along the first dielectric 22 is interrupted. In the off-state, when a voltage level of the voltage (drain-source voltage) between the drain node D and the source node S increases, depletion regions (space charge regions) expand in the drift region 11 and the compensation regions 12, wherein these depletion regions further expand as the drain-source voltage increases. According to one example, doping concentrations of the drift region 11 and the compensation regions 12 are such that these regions 11, 12 can completely be depleted of charge carriers.

Unlike a conventional superjunction transistor device, the compensation region 12 adjoins the first and second dielectric 22, 24 below the body region 14, so that in the on-state of the transistor device there is a conducting channel along the first dielectric 22 not only in the body region 14 but also the compensation region 12. Implementing the compensation region 12 such that it adjoins first and second dielectric 22, 24 may help to improve the short-circuit robustness of the transistor device and offers further degrees of freedom with regard to the design of the overall transistor device.

Referring to FIG. 1, the transistor cells 10 are spaced apart from each other in the first lateral direction x, so that a second mesa region 112 is arranged between two neighboring transistor cells 10. The second mesa region 112 is arranged between one of the first and second trenches of one of the two neighboring transistor cells 10 and one of the first and second trenches of the other one of the neighboring transistor cells 10.

The second mesa regions 112 may be implemented in various ways, wherein some examples are explained in the following. It should be noted that the transistor device can be implemented with only one type of second mesa region 112. According to another example, one or more different types of second mesa regions 112 are combined in one transistor device.

According to one example, illustrated in FIG. 1, one or more of the second mesa regions 112 include a section of the drift region 11 that extends to the first surface 101. In this example, the first dielectric 22 is adjacent the drift region section arranged in the second mesa region 112 and is dielectrically insulated from the drift region 11 by the first dielectric 22. A transistor device of this type has a relatively high gate-drain-capacitance, which is a capacitance between the gate node G and the drain node D. The gate-drain capacitance influences a switching behavior of the transistor device. The gate-drain-capacitance, for example, has an effect on how fast the transistor device switches on or off when a voltage level of the gate-source voltage changes, wherein the switching speed decreases as the gate-drain-capacitance increases. Such decrease of the switching speed is desirable in various applications.

The first trench electrodes 21 are gate electrodes of the transistor device, and the first dielectrics 22 are gate dielectrics. Referring to the above, the second trench electrodes 23 are connected to the gate node G, are connected to the source node S or are floating. The latter includes that the second trench electrodes are not connected to any terminal having a defined electric potential. A second trench electrode 23 connected to the gate node G operates in the same way as the first trench electrode 21 and forms a further gate electrode, so that, in the on-state of the transistor device a conducting channel is generated in the body region 14 and the compensation region 12 along the second dielectric 24. Further, in this case, the second dielectric 24 forms a further gate dielectric.

When the second trench electrode 23 is connected to the source node S or is floating and when the transistor device is in the on-state, no such channel is generated in the body region 14 and the compensation region 12 along the second dielectric 24. In this case, the source region 13 may be implemented such that it is spaced apart from the second dielectric 24. That is, the source region 13 may be implemented such that it adjoins the first dielectric 22 (the gate dielectric) but, in the first lateral direction x, does not extend to the second dielectric 24.

In the following, a transistor cell 10 in which both the first trench electrode 21 and the second trench electrode 23 are connected to the gate node G is referred to as first type transistor cell 10a, and a transistor cell 10 in which the first trench electrode 21 is connected to the gate node G and the second trench electrode 23 is either connected to the source node S or is floating is referred to as second type transistor cell 10b.

(a) According to one example, the transistor device, from the first type transistors cells and the second type transistor cells, only includes first type transistor cells 10a.

(b) According to another example, the transistor device, from the first type transistors cells and the second type transistor cells, only includes second type transistor cells 10b.

(c) According to yet another example, the transistor device includes both first type transistor cells 10a and second type transistor cells 10b. In this type of transistor device, the gate-drain capacitance can be adjusted by suitably selecting a ratio between the number of first type transistor cells 10a and the number of second type transistor cells 10b. Basically, the higher the number of first type transistor cells 10a, relative to the number of second type transistor cells 10b, the higher the gate-drain capacitance.

Figure 2:
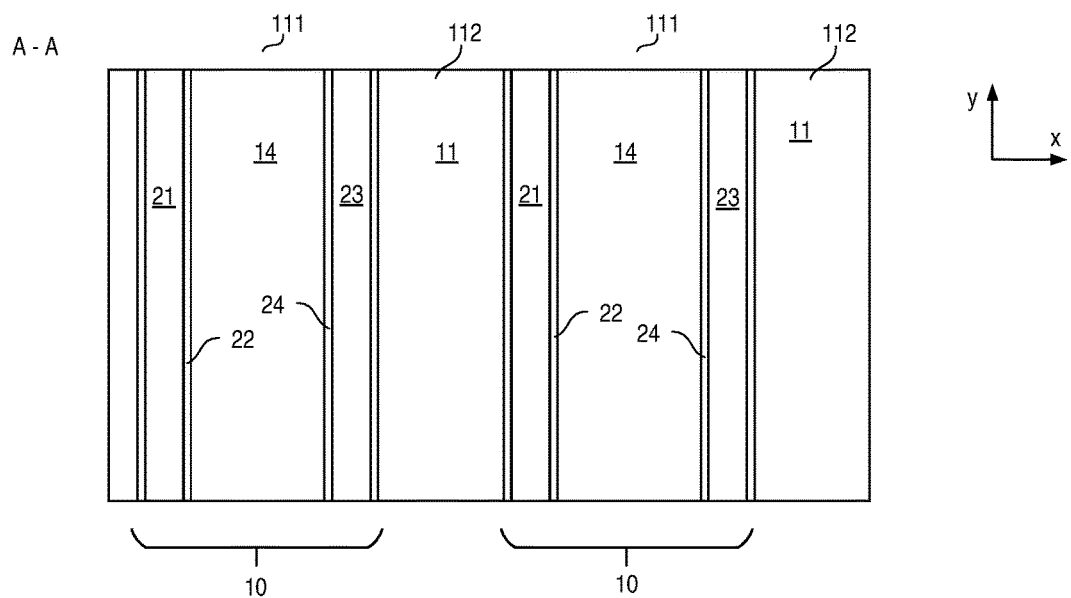
FIG. 2 shows one example of a horizontal cross sectional view of a transistor device of the type shown in FIG. 1.

According to one example, the transistor cells 10 are elongated transistor cells. A horizontal cross sectional view of a transistor device of the type shown in FIG. 1 that includes elongated transistor cells 10 is shown in FIG. 2. FIG. 2 shows a horizontal cross sectional view of the semiconductor body 100 in a horizontal section plane A-A that cuts through the first and second trench electrodes 21, 23 and the first and second mesa regions 111, 112. The elongated transistor cells 10 of the type shown in FIG. 2 may also be referred to as stripe cells. In these transistor cells, the first and second trench electrodes 21, 23 are elongated in a second lateral direction y of the semiconductor body 100, wherein the second lateral direction y is essentially perpendicular to the first lateral direction x, in which the first and second trench electrodes 21, 23 are spaced apart from each other. According to one example, "elongated" means that a dimension of the first and second trench electrodes 21, 23 in the second lateral direction y is significantly greater than a dimension of the first and second trench electrodes 21, 23 in the first lateral direction x. The dimension of the first and second trench electrodes 21, 23 in the first lateral direction x may also be referred to as width, and the dimension in the second lateral direction y may also be referred to as length. According to one example, the length is at least 100 times, at 1000 times, or at least 10000 times the width. According to one example, a width of the first and second trenches is between 300 nanometers (nm) and 2 micrometers (μm), for example. Each of the first mesa regions 111 and the second mesa regions 112 has a width, which is a dimension of the respective mesa region 111, 112 in the first lateral direction x. The width of the first mesa region 111 is the (shortest) distance between the first trench with the first trench electrode 21 and the second trench with the second trench electrode 23 of one transistor cell 10. The width of the second mesa region 112 is the (shortest) distance in the first lateral direction x between the two trenches of neighboring transistor cells that adjoin the mesa region 112. According to one example, the first mesa regions 111 essentially have the same width. Furthermore, the second mesa regions 112 may have the same width. According to one example, the widths of the first mesa regions 111 and the widths of the second mesa regions 112 are essentially the same. According to another example, the widths of the first mesa regions 111 and the widths of the second mesa regions 112 are different. According to one example, the widths of the first and second mesa regions are between 300 nanometers (nm) and 5 micrometers (μm), in particular between 500 nm and 1 μm.

Figure 3:
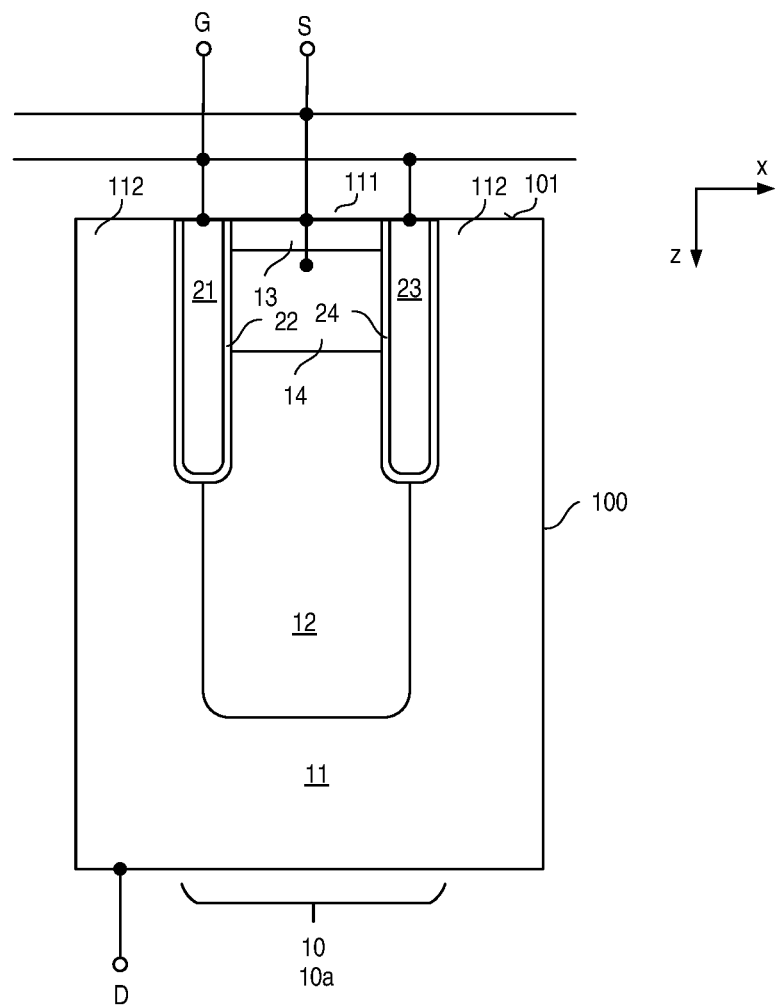
FIG. 3 shows one example of a transistor device of the type shown in FIG. 1 in greater detail.

FIG. 3 illustrates one example of a first transistor cell 10a, that is, a transistor cell in which both the first trench electrode 21 and the second trench electrode 23 are connected to the gate node.

Figure 4A:
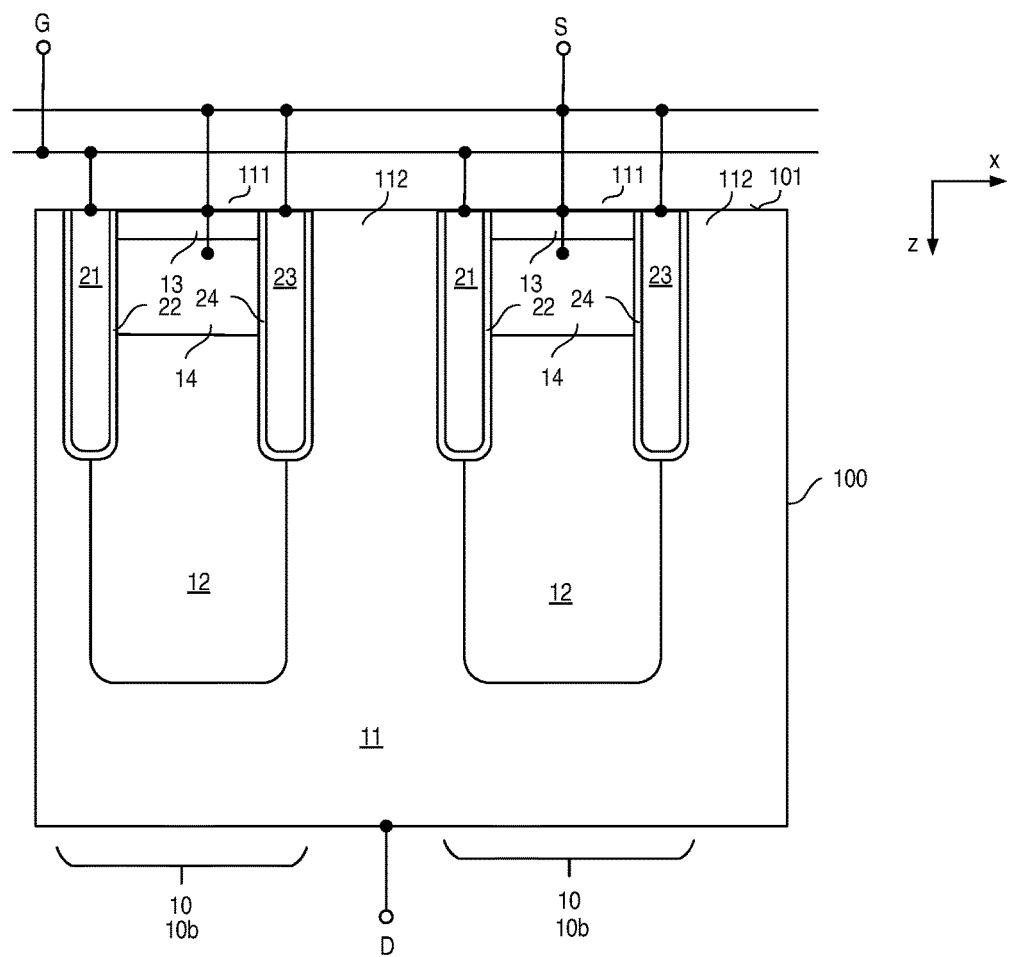
FIGS. 4A to 4C show further examples of a transistor device of the type shown in FIG. 1 in greater detail.

FIG. 4A illustrates one example of a section of the transistor device in which two second type transistor cells 10b are arranged. In this example, the second type transistor cells 10b are orientated such that the first trench of one of the two transistor cells 10b and the second trench of the other one of the two transistor cells 10b adjoin the mesa region 112 arranged between the two transistor cells 10b.

Figure 4B:
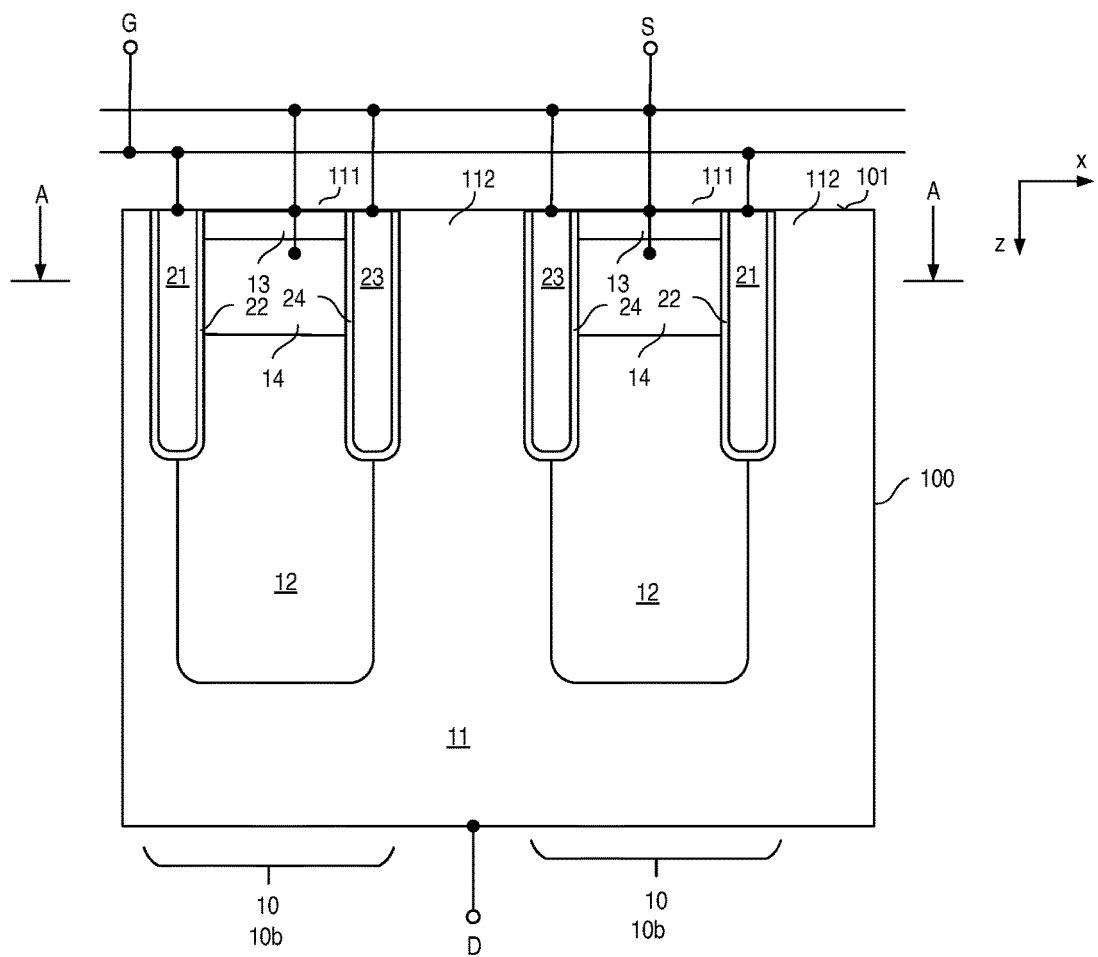

According to another example illustrated in FIG. 4B, the second type transistor cells 10b are orientated such that, form the two second type transistor cells 10b, the second trenches 23 adjoin the second mesa region 112 arranged between the two transistor cells 10b.

Figure 4C:
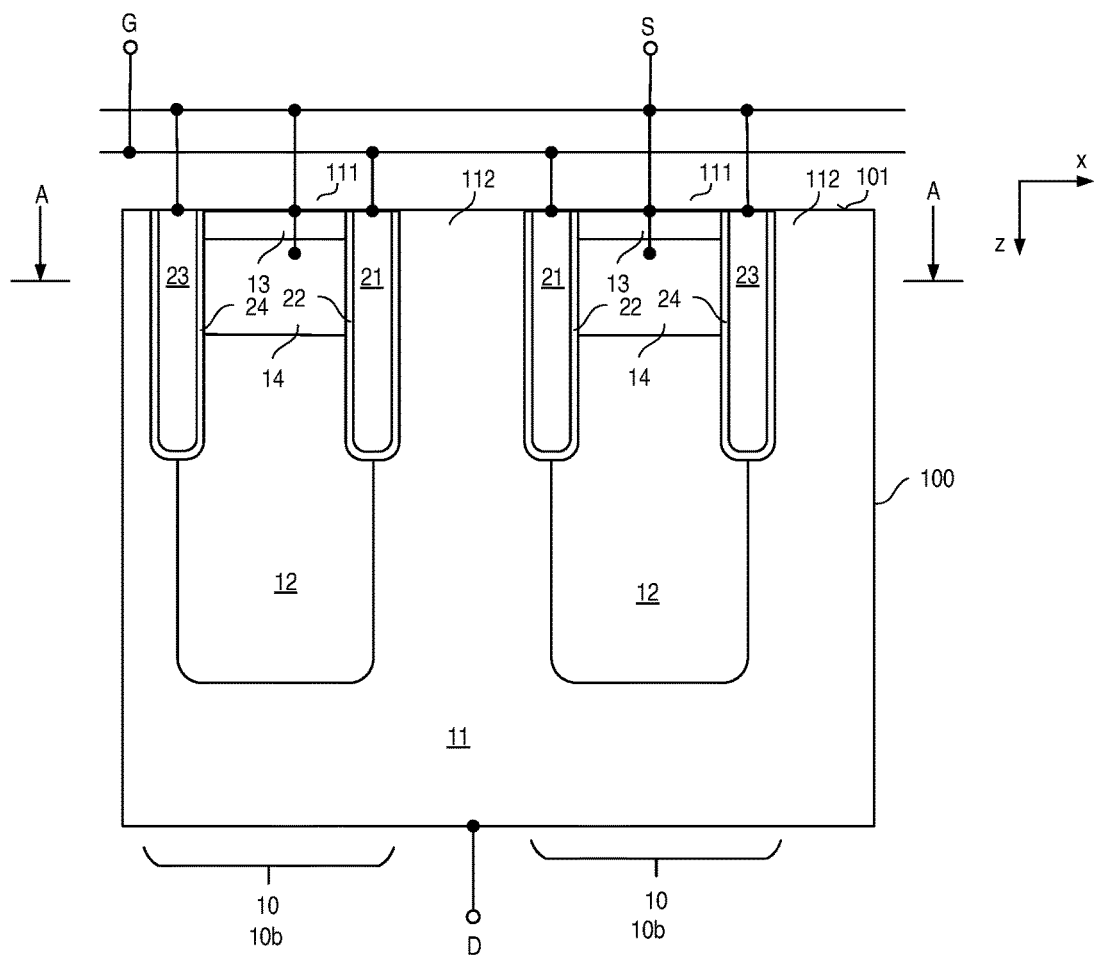

According to another example illustrated in FIG. 4C, the second type transistor cells 10b are orientated such that the first trenches adjoin the mesa region 112 arranged between the two transistor cells 10b.

It should be noted that the topology of the first type transistor cells 10a and the second type transistor cells 10b inside the semiconductor body 100 is identical. Whether a transistor cell 10 is a first type transistor cell 10a or a second type transistor cell 10b is only dependent on where the second trench electrode 21 is connected to. In the first type transistor cell 10a, the second trench electrode 22 is connected to the gate node G, so that both the first trench electrode 21 and the second trench electrode 23 are connected to the gate node G. In the second type transistor cells 10b, the second trench electrode 22 is connected to the source node S and the first trench electrode 21 is connected to the gate node G. Referring to the above, by suitably selecting the number of first type transistor cells 10a and the second type transistor cells 10b, the gate-drain capacitance of the transistor device can be adjusted. By implementing the first type transistor cells 10a and the second type transistor cells 10b, such that they have the same topology inside the semiconductor body 100, the semiconductor bodies of various kinds of transistor devices can be manufactured in the same way, wherein the properties of the transistor device, such as the gate-drain capacitance, can be adjusted by suitably wiring the first and second trench electrodes 21, 23 using at least one metallization layer (that is, one or more metallization layers) formed on top of the first surface 101. Examples for wiring the first and second trench electrodes 21, 23 are explained herein further below.

Figure 5:
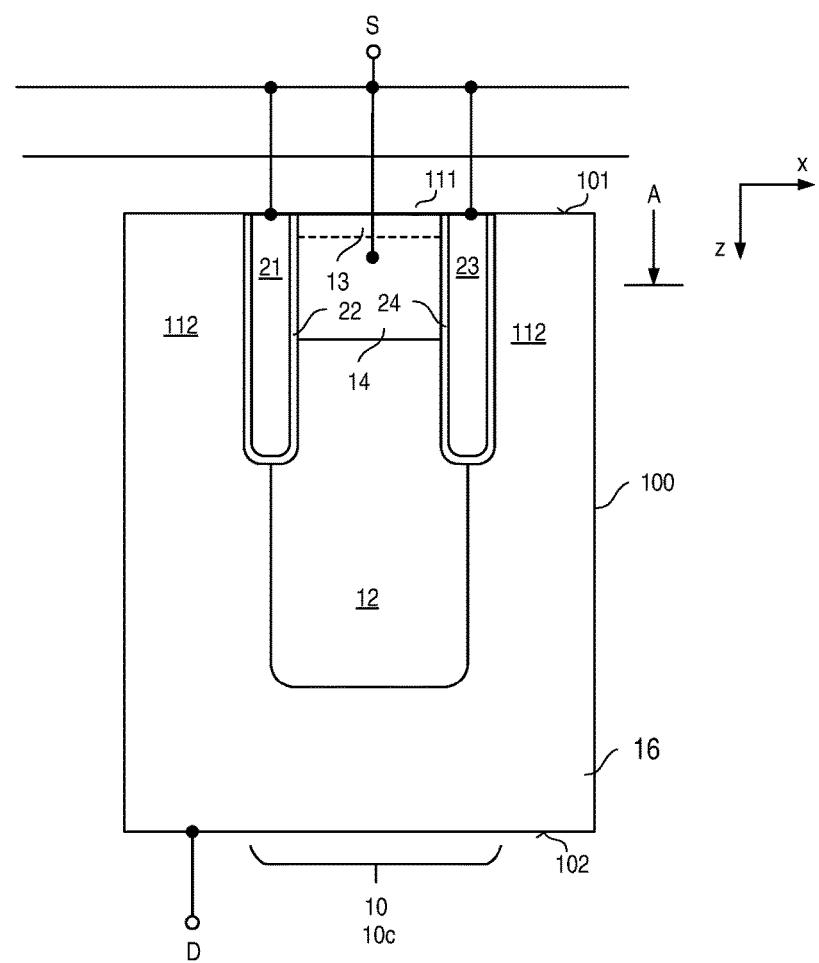
FIG. 5 shows a vertical cross sectional view of a superjunction transistor device according to another example.

According to one example, the transistor device, in addition to at least one of the first type transistor cells 10a and the second type transistor cells 10b, may include at least one third type transistor cell 10c. One example of a third type transistor cell 10c is illustrated in FIG. 5. In this third type transistor cell 10c, both, the first trench electrode 21 and the second trench electrode 23 are connected to the source node S or are floating. It is also possible that one of the first trench electrode 21 and the second trench electrode 23 is connected to the source node S and the other one of the first trench electrode 21 and the second trench electrode 23 is floating.

Thus, in the on-state of the transistor device, there is no conducting channel along the first and second dielectrics 22, 24 of the first type transistor cell 10c. The source region 13 is optional in this type of transistor cell, because the source region 13 does not have a technical effect in this type of transistor cell. However, the third type transistor cell 10c may include a source region 13 (because whether or not the transistor cell is a third type transistor cell is only dependent on which of the gate node G and the source node S, the first and second trench electrodes 21, 23 are connected to). In addition to one or more third type transistor cells 10c, the transistor device may include (i) only first type transistor cells, (ii) only second type transistor cells, or (iii) both first type transistor cells and second transistor cells.

Figure 6:
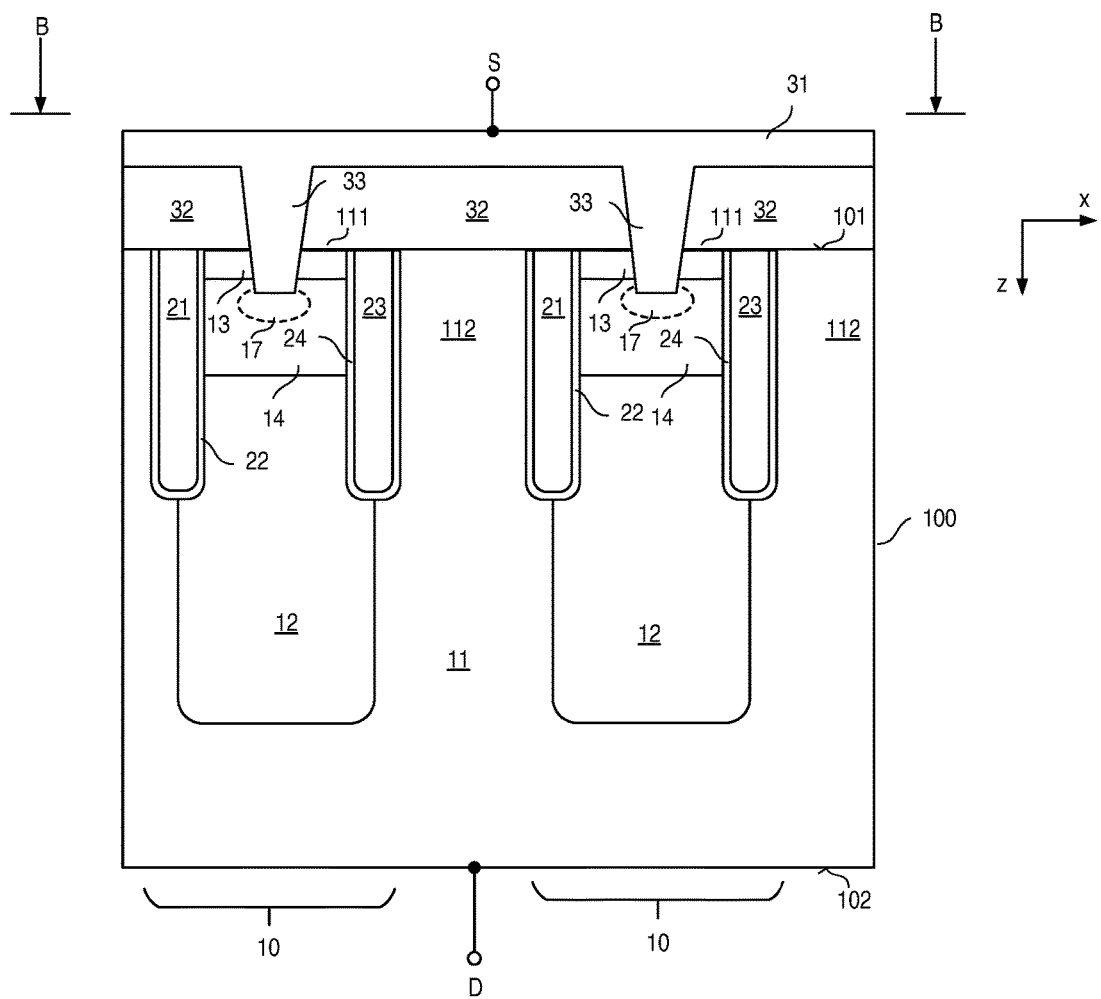
FIG. 6 shows one example of the transistor device shown in FIG. 2 in greater detail.

FIG. 6 shows one example of the transistor device in greater detail. In this example, the transistor device includes a source metallization 31. The source metallization 31 is formed on top of an insulation layer 32, wherein the insulation layer 32 is formed on top of the first surface 101 of the semiconductor body 100. The source metallization 31 is connected to the source node S or forms the source node S of the transistor device.

Referring to FIG. 6, electrically conducting vias 33 extend from the metallization layer 31 through the insulation layer 32 to the semiconductor body 100 or into the semiconductor body 100 and are electrically connected to the source regions 13 and the body regions 14 of the individual transistor cells 10. "Electrically connected" in this case may include that the electrically conducting vias 33 are ohmically connected to the source regions 13 and the body regions 14. While a doping concentration of the source regions 13 may be high enough to form an ohmic contact between the source regions 13 and the conducting vias 33, a doping concentration of the body regions 14 may be too low to form such ohmic contacts. In this case, the body regions 14 may include contact regions 17 of the second doping type, wherein these contact regions 17 adjoin the electrically conducting vias 33 and have a doping concentration that is high enough to form ohmic contacts between the body regions 14 and the electrically conducting vias 33.

The electrically conducting vias 33 may be elongated in the second lateral direction y. According to another example, the source region 13 and the body region 14 of one transistor cell 10 may be connected to the source metallization 31 by two or more contact vias that are spaced apart from each other in the second lateral direction y.

Figure 7:
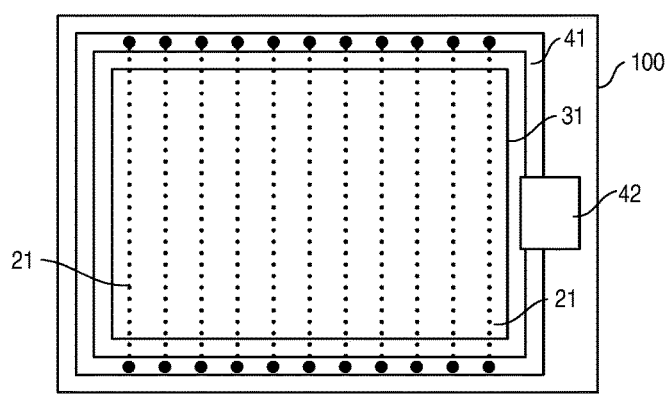
FIG. 7 shows one example of a top view of the transistor device shown in FIG. 6.

FIG. 7 shows a top view of one example of a transistor device of the type shown in FIG. 6. FIG. 7 shows a top view of the overall transistor device, wherein the position of the first trench electrodes 21 in the semiconductor body 100 are illustrated in dotted lines. In this example, the first trench electrodes 21 are elongated trench electrodes, wherein at least one lateral end of these trench electrodes 21 extends beyond the source metallization 31. In a region of this at least one lateral end, each first trench electrodes 21 is electrically connected to a gate runner 41. The gate runner 41 is spaced apart from the source metallization 31 and is electrically connected to a gate pad 41. The gate pad 41 forms the gate node G of the transistor device or is connected to the gate node G.

The first trench electrodes 21, in the vertical direction z, are arranged below the gate runner 41 and are electrically connected to the gate runner 41 by electrically conducting vias. The position of these vias is schematically illustrated by black dots in the example shown in FIG. 7.

Referring to the above, at least one lateral end of each first trench electrode 21 may extend beyond the source metallization 31. That is, one lateral end may extend beyond the source metallization 31 and be connected to the gate runner. Alternatively, as illustrated in FIG. 7, the first trench electrodes 21 may extend beyond the source metallization 31 on opposite ends, so that each first trench electrode 21 has a first end and an opposite second end connected to the gate runner 41. In FIG. 7, the second trench electrodes 23 are not illustrated. Second trench electrodes 23 that are connected to the gate node G may be connected to the gate runner 41 in the same way as the first trench electrodes 21 illustrated in FIG. 7. Connecting the second trench electrodes 23 to the source metallization 31 in second type transistor cells 10b or third type transistor cells can be achieved in the same way as connecting the source and body regions 13, 14 to the source metallization 31.

Figure 8:
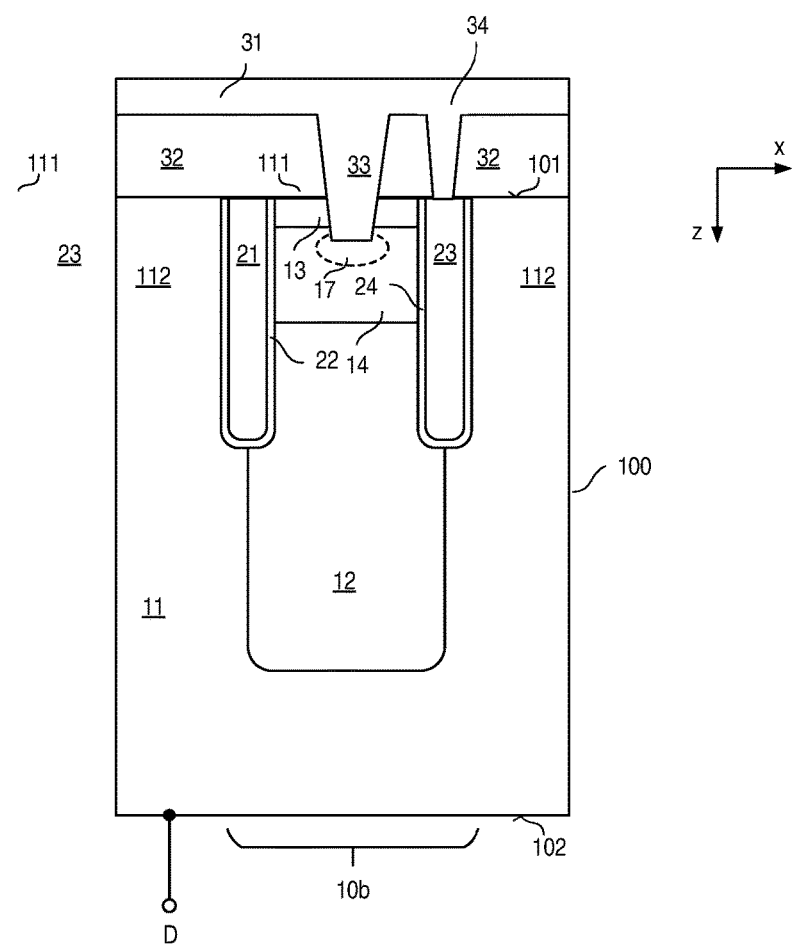
FIG. 8 shows one example of the transistor device shown in FIG. 4A in greater detail.

FIG. 8 shows one example of a second type transistor cell 10b in greater detail. In this example, the second trench electrode 23 is connected to the source metallization 31 through a further electrically conducting via 34. This further electrically conducting via 34 extends from the source metallization 31 through the insulation layer 32 to the second trench electrode 23.

Figure 9:
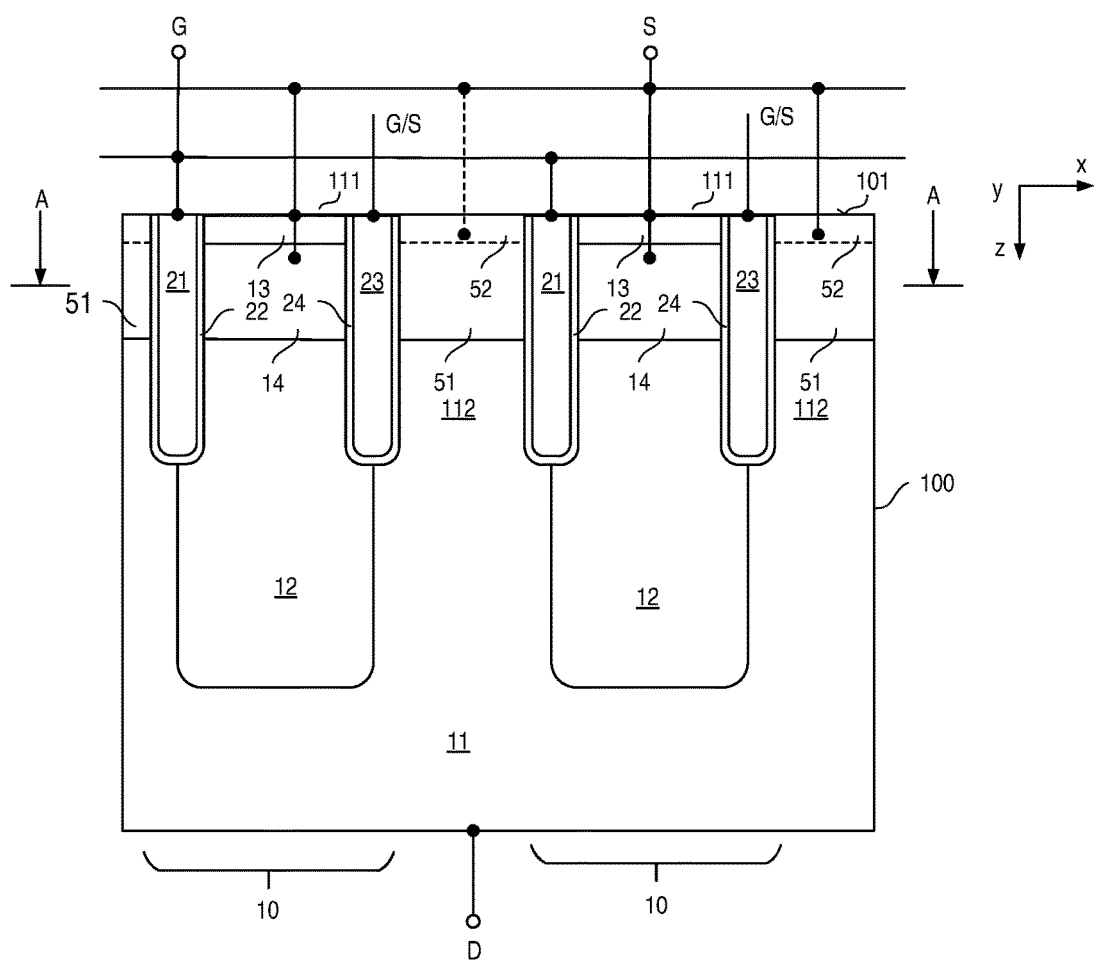
FIG. 9 shows a vertical cross sectional view of a semiconductor device that includes a superjunction transistor device and a pn diode in parallel with the superjunction transistor device.

FIG. 9 shows a modification of the transistor device shown in FIG. 1. In the transistor device shown in FIG. 9, a doped region 51 of the second doping type is arranged in at least one of the second mesa regions 112. According to one example, each of the second mesa regions 112 includes a doped region 51 of the second doping type. According to another example, less than each of the second mesa regions 112 includes a doped region 51 of the second doping type, wherein the remainder of the second mesa regions 112 may be implemented as explained with reference to FIG. 6. According to one another example (not illustrated), one second mesa region 112 includes several doped regions 51 of the second doping type, wherein these several doped regions 51 of the second doping type are spaced apart from each other in the second lateral direction y, wherein a respective section of the drift region 11 is arranged between two neighboring doped regions 51 of the second doping type.

According to one example, a vertical dimension (depths) of the at least one doped region 51 of the second doping type essentially equals the vertical dimension (depths) of the body regions 14. The "vertical dimension" is the dimension in the vertical direction z. According to one example, a doping concentration of the doped region 51 of the second doping type essentially equals the doping concentration of the body regions 14.

According to one example, the doped region 51 of the second doping type is electrically connected to the source node S. An electrical connection between the doped region 51 and the source node S is schematically illustrated in dashed lines in FIG. 9. In this example, the doped region 51 of the second doping type, which may also be referred to as diode region, and the drift region 11 form a diode between the source node S and the drain node D. For ohmically connecting the diode region 51 to the source node S, the transistor device may include a contact region 52 of the second doping type. The contact region 52 adjoins the diode region 51, is connected to the source node S and has a doping concentration that is high enough in order to achieve an ohmic contact between the contact region 52 and the source node S. The diode region 51 and the optional contact region 52 may be connected to the source node S in the same way as the body regions 14. That is, in a transistor device that includes a source metallization of the type shown in FIG. 6, the diode region 51 may be connected to the source metallization through an electrically conducting via. The at least one diode region 51 adjoins the drift region 11, so that a pn junction is formed between the diode region 51 and the drift region 11. Thus, a diode is formed between the source node S and the drain node D by the diode region 51 and the drift region 11.

According to another example the doped region 51 of the second doping type is floating. That is, this region is not electrically connected to the source node S. The contact region 52 may be omitted in this case.

Figure 10:
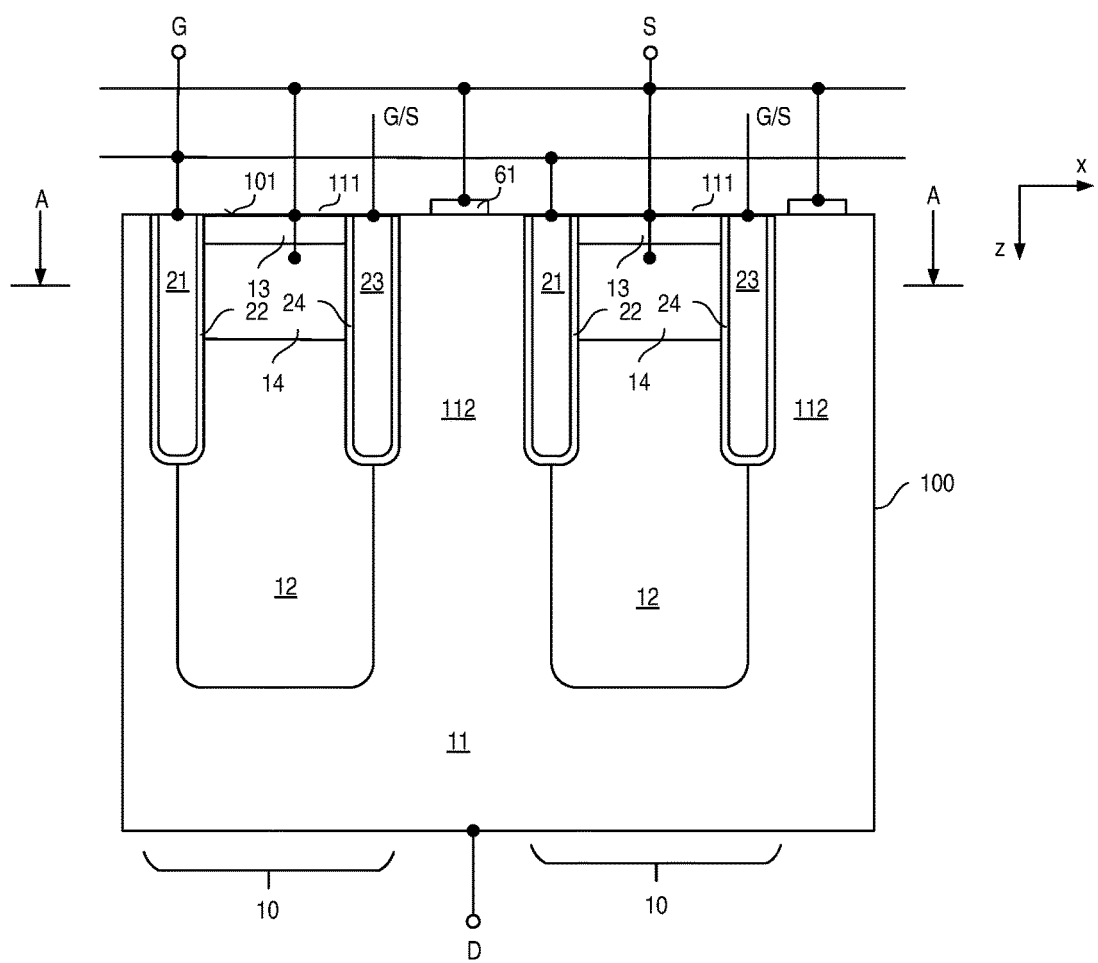
FIG. 10 shows a vertical cross sectional view of a semiconductor device that includes a superjunction transistor device and a Schottky diode in parallel with the superjunction transistor device.

FIG. 10 shows a modification of the transistor device shown in FIG. 9. In the transistor device shown in FIG. 10, a Schottky metal 61 is formed on top of the second mesa regions 112 (as illustrated) or in the second mesa regions 112 (not illustrated), wherein the Schottky metal 61 is electrically connected to the source node S. A Schottky contact is formed between the Schottky metal layer 61 and the drift region 11 in the second mesa regions 112, so that a Schottky diode is formed between the drain node D and the source node S of the transistor device. This Schottky diode may have a lower forward voltage than a body diode formed by the body regions 14, the compensation regions 12 and the drift region 11. Thus, when the transistor device is in the reverse biased state, the Schottky diode 61 may conduct a reverse current and keep the drain-source voltage on a voltage level that is too low for the body diode to conduct. In this way, the generation of a charge carrier plasma that includes first type charge carriers (electrons or holes) and second type charge carriers (holes or electrons) may be prevented. This may be useful with regard to reducing switching losses of the transistor device.

Figure 11:
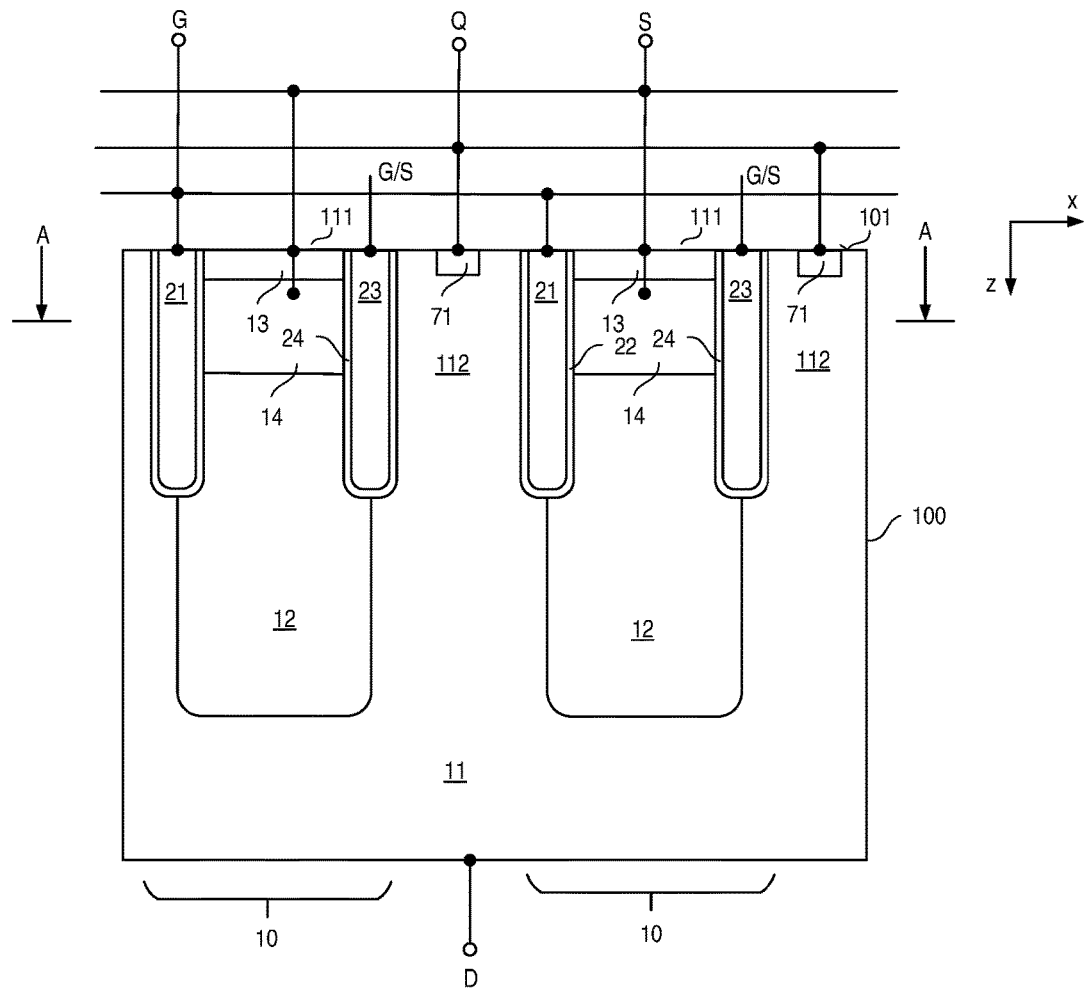
FIG. 11 illustrates another example of a superjunction transistor device.

FIG. 11 shows a further modification of the transistor device shown in FIG. 1. In the transistor device shown in FIG. 11, the drift region 11 in the second mesa regions 112 is electrically connected to a further circuit node Q of the transistor device. This further circuit node Q is also referred to as bias node in the following. The drift region 11 may be connected to the bias node Q via a contact region 71 of the first doping type, wherein a doping concentration of this contact region 71 is high enough to provide an ohmic contact between the drift region 11 and the bias node Q.

Figure 12:
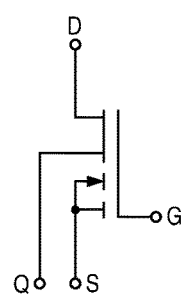
FIG. 12 shows a circuit symbol of the transistor device shown in FIG. 11.

The transistor device shown in FIG. 11 includes four terminals or circuit nodes, the gate node G, the drain node D, the source node S, and the bias node Q. A circuit symbol of this transistor device is shown in FIG. 12. This circuit symbol is based on the circuit symbol of a MOSFET and additionally includes the bias node Q. Just for the purpose of illustration, with regard to the circuit symbol shown in FIG. 12, it is assumed that the transistor device is an n-type transistor device.

Referring to the above, in the reverse operating state of the transistor device, the body diode may become forward biased so that, in the reverse direction of the transistor device, a current flows between the source node S and the drain node D. Forward biasing the body diode includes generating a charge carrier plasma with first and second type charge carriers in the drift region 11 and the compensation regions 12. When the transistor device switches from the reversed biased state to the off-state (the operating state in which the transistor device is forward biased and the conducting channels are interrupted), this charge carrier plasma is removed from the semiconductor body 100 and an internal output capacitance of the transistor device is charged. Removing the charge carrier plasma and charging the output capacitance is associated with a current, which may also be referred to as discharging current. This discharging current is associated with losses. Basically, the higher the voltage across a current path in which the discharging current flows, the higher the losses associated with removing the charge carrier plasma from the device. If, for example, the transistor device forms one of two electronic switches in a half-bridge, the discharging current may flow via a current path across which a supply voltage of the half-bridge is available. This supply voltage may be in the range of several hundred volts, such as 400 V, in power converter applications, so that losses associated with removing the charge carrier plasma may be significant.

Figure 13:
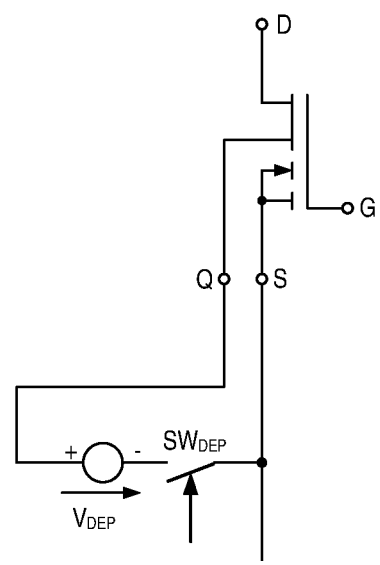
FIG. 13 illustrates an electronic circuit that includes a transistor device of the type shown in FIG. 11.

The bias node Q can be used to provide a discharging current path that offers lower switching losses. Referring to FIG. 13, a series circuit with a bias voltage source that provides a bias voltage $V_{DEP}$ and a switch $SW_{DEP}$ may be connected between the bias node Q and the source node S.

When the switch $SW_{DEP}$ is closed, the bias voltage $V_{DEP}$ reverse biases the pn junctions between the drift region 11 and the compensation region 12 and the switch $SW_{DEP}$ and the bias voltage source form a current path for removing the charge carrier plasma (and a large share of the output charges associated with charging the output capacitance). The bias voltage $V_{DEP}$ is between 5 V and 30 V, for example, and, according to one example, is significantly lower than a voltage blocking capability of the transistor device.

Figure 14A:
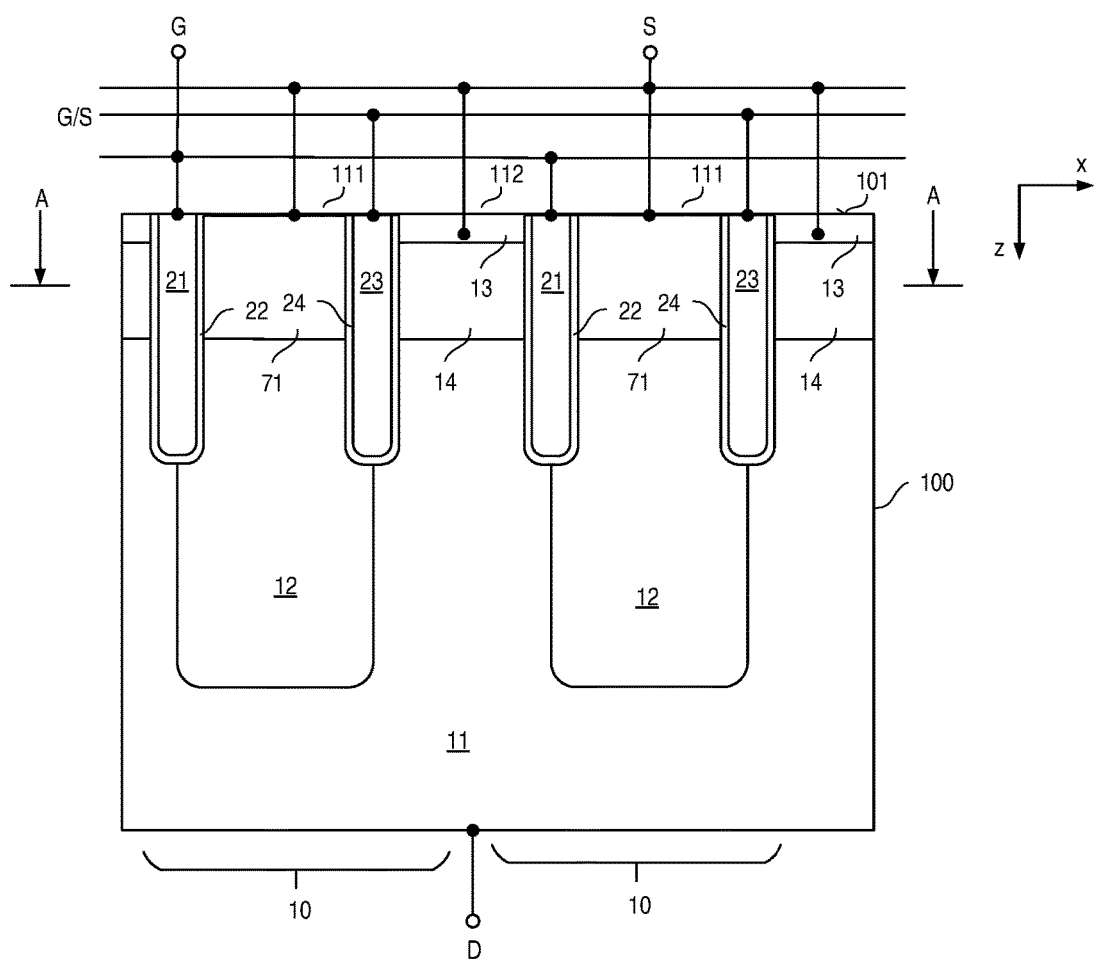
FIGS. 14A and 14B shows further examples of a superjunction transistor device.

FIG. 14A shows a vertical cross sectional view of a superjunction transistor device according to another example. In this example, the source regions 13 and the body regions 14 are arranged in the second mesa regions 112. The compensation regions 12 are either directly connected to the source node S or are connected to the source node S via connection regions 71 of the second doping type. A doping concentration and a depth (in the vertical direction) of these connection regions 71 may correspond to a depth and a doping concentration of the body regions 14. The connection regions 71 or the compensation region 12 are ohmically connected to the source node S. In this example, each of the transistor cells 10 includes a section of the second mesa region 112.

Figure 14B:
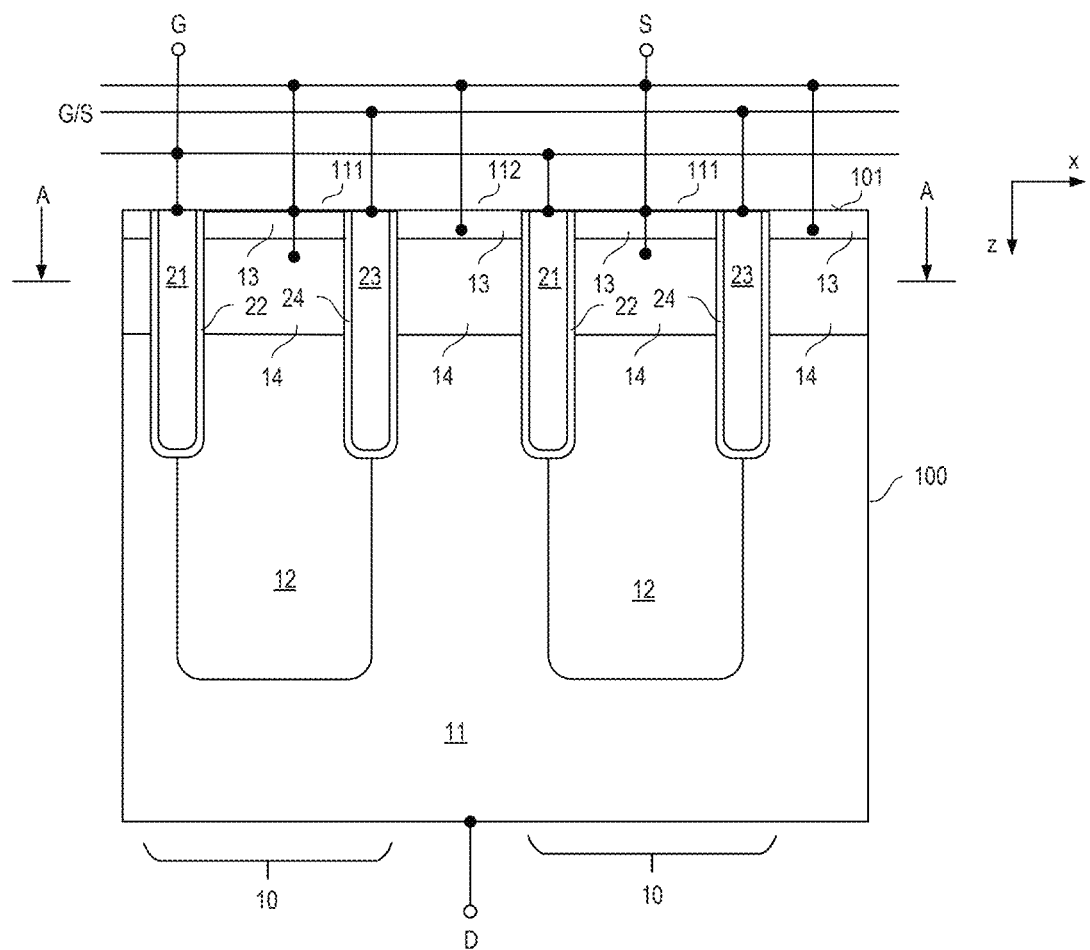

FIG. 14B shows a modification of the transistor device shown in FIG. 14A. This transistor device is a combination of the transistor device shown in FIG. 1 and the transistor device shown in FIG. 14A and includes the source regions 13 and the body regions 14 in both the first mesa regions 111 and the second mesa regions 112. Thus, transistor cells are formed in both the first and second mesa regions 111, 112, wherein the transistor cells in the second mesa regions 112 have a shorter channel length than the transistor cells in the first mesa regions. The channel length of a transistor cell in the second mesa regions 112 is essentially given by a shortest distance between the source regions 13 and the drift region 11 along the gate dielectric 21. The channel length of a transistor cell in the first mesa regions 112 is essentially given by a length of a path along the gate dielectric 21 from the source region 13 through the body region 14 and the compensation region 12 to the drift region 11.

Figure 15:
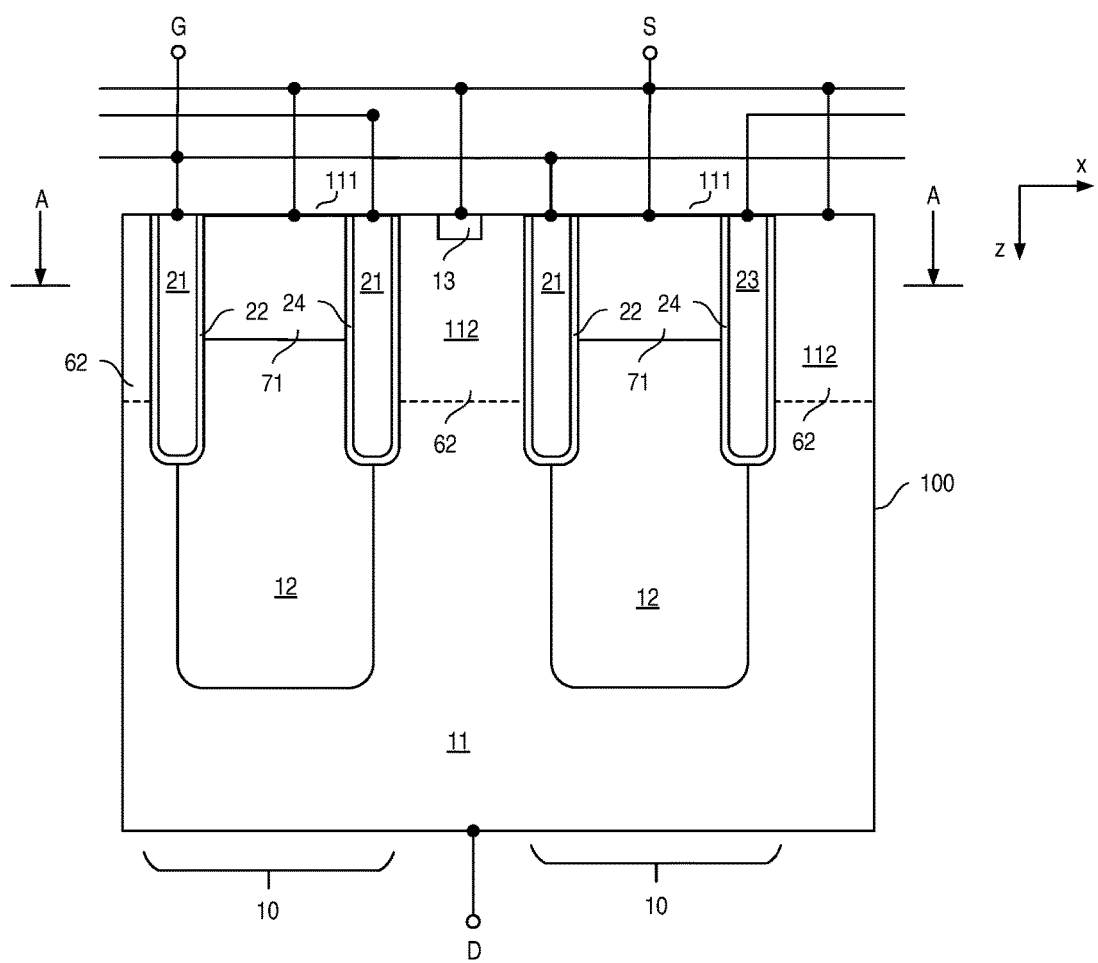
FIG. 15 shows another example of a superjunction transistor device.

FIG. 15 shows a modification of the transistor device shown in FIG. 14A. The transistor device shown in FIG. 15 is a depletion transistor. That is, the drift region 11, in the second mesa regions 112, adjoins the source region 13 and source regions in the first mesa regions 111 are omitted. Optionally, a doped region 62 of the first doping type that has a doping concentration that is different from the doping concentration of the drift region 11 is arranged in the second mesa regions 112 between the drift region 11 and the source region 13. By suitably selecting the doping concentration of this doped region 62, the pinch-off voltage of the transistor device can be adjusted.

Figure 16:
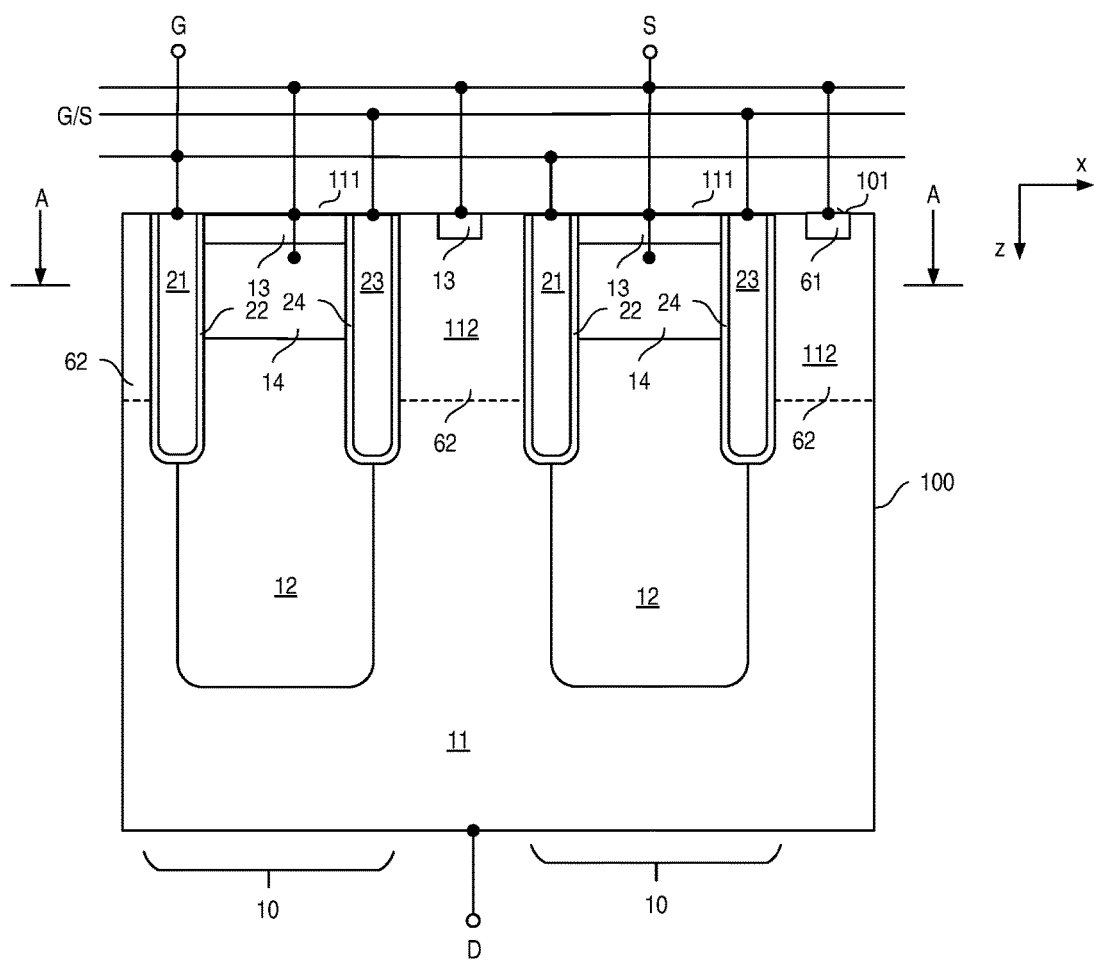
FIG. 16 shows yet another example of a superjunction transistor device.

FIG. 16 shows a modification of the transistor device shown in FIG. 15. The transistor device shown in FIG. 16 includes both depletion transistor cells of the type illustrated in FIG. 15 and transistor cells of the type illustrated in FIG. 1. The source region 13 in the second mesa 112 may also be electrically connected to a further circuit node Q.

In each of the first type transistor cells 10a and the second type transistor cells 10b, the conducting channel, in the on-state of the transistor device, is formed along the gate dielectric in the body region 14 and the compensation region 12. Referring to the above, the "gate dielectric" is the first dielectric 22 and, when the second trench electrode 23 is connected to the gate node G, also the second dielectric 24. As illustrated in FIGS. 1, 3, and 4A-4C, for example, the compensation region 12 may adjoin sidewalls and bottoms of the trenches with the first and second trench electrodes 21, 23. Thus, the conducting channel, in the compensation region 12, is formed along a corner of the gate dielectric formed between a sidewall and a bottom of the respective trench.

Figure 17:
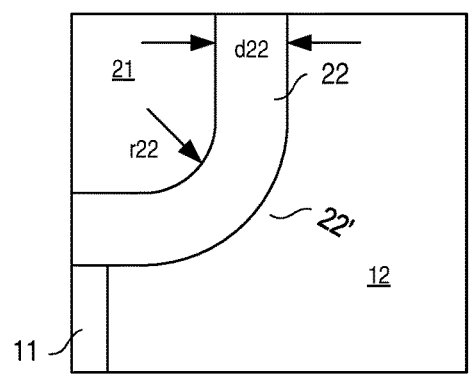
FIG. 17 illustrates one example of a gate dielectric of the superjunction transistor device in greater detail.

One example of such corner of the gate dielectric in a region that adjoins the compensation region 12 is illustrated in FIG. 17. Just for the purpose of illustration, the gate dielectric is a first dielectric 22 in this example. According to one example, in order to prevent a voltage breakdown at the corner and in order to prevent that the conducting channel has a locally increased resistance in the region of the corner, the gate dielectric 22 has a rounded corner 22'. According to one example, an inner radius r22 of the gate dielectric 22 in the corner region 22' is at least 50% of a thickness d22 of the gate dielectric 22, $r22>0.5*d22$. The "inner radius" is the radius of the gate dielectric 22 in a region where the gate dielectric 22 adjoins the gate electrode (first trench electrode) 21.

According to one example, the inner radius r22 at least equals the thickness d22 of the gate dielectric 22, $r22>d22$. Basically, the inner radius is between 0.5 times and 3 times the thickness d22, for example, that is $0.5*d22<r22<3*d22$. A rounded corner of the gate dielectric 22 can be achieved by suitably etching the trench before forming the gate dielectric 22 and/or by a suitable process for forming the gate dielectric 22. According to one example, the gate dielectric is a thermally grown oxide.

Although the present disclosure is not so limited, the following numbered examples demonstrate one or more aspects of the disclosure.

Example 1. A transistor device, comprising: a semiconductor body; a drift region in the semiconductor body; a plurality of transistor cells; and a gate node and a source node; wherein each of the plurality of transistor cells comprises: a first trench electrode insulated from the semiconductor body by a first dielectric layer; a second trench electrode insulated from the semiconductor body by a second dielectric layer; a source region and a body region in a first mesa region between the first trench electrode and the second trench electrode; and a compensation region, wherein the compensation region adjoins the body region, the first dielectric, the second dielectric, and forms a pn-junction with the drift region, and wherein from the first trench electrode and the second trench electrode at least the first trench electrode is connected to the gate node.

Example 2. The transistor device of example 1, wherein the plurality of transistor cells comprise at least one first type transistor cell in which the first trench electrode is connected to the gate node and the second trench electrode is connected to the gate node.

Example 3. The transistor device of example 1 or 2, wherein the plurality of transistor cells comprise at least one second type transistor cell in which the first trench electrode is connected to the gate node and the second trench electrode is connected to the source node.

Example 4. The transistor device of example 2 or 3, wherein the plurality of transistor cells comprise at least one third type transistor cell in which the first trench electrode is connected to the source node and the second trench electrode is connected to the source node.

Example 5. The transistor device of any one of the preceding examples, further comprising: a plurality of second mesa regions each arranged between two neighboring transistor cells and adjoining a first surface of the semiconductor body.

Example 6. The transistor device of example 5, wherein at least one of the plurality of second mesa regions comprises a section of the drift region that extends to the first surface.

Example 7. The transistor device of example 5 or 6, wherein at least one of the plurality of second mesa regions comprises a doped region that forms a pn-junction with the drift region.

Example 8. The transistor device of any one of examples 5 to 7, further comprising: a Schottky contact formed between the source node and the drift region in at least one of the second mesa regions.

Example 9. The transistor device of example 5, further comprising: a bias node different from the source node, wherein the bias node is connected to the drift region in the second mesa region.

Example 10. The transistor device of any one of the preceding examples, further comprising: a drain region connected to a drain node or forming a drain node of the transistor device.

Example 11. The transistor device of any one of the preceding examples, wherein at least the first dielectric layer comprises a rounded corner in a region where the first dielectric layer adjoins the compensation region.

Example 12. The transistor device of example 11, wherein an inner radius of the rounded corner is between 0.5 times and 3 times of a thickness of the first dielectric layer.

Example 13. An electronic circuit, comprising: a transistor device of any one of examples 9 to 12; and an electronic switch and a bias voltage source connected in series between the source node and the bias node.

Example 14. A transistor device, comprising: a semiconductor body; a drift region in the semiconductor body; a plurality of transistor cells; and a gate node and a source node; wherein each of the plurality of transistor cells comprises: a first trench electrode insulated from the semiconductor body by a first dielectric layer; a second trench electrode insulated from the semiconductor body by a second dielectric layer; a source region and a body region; and a compensation region, wherein the compensation region adjoins the first dielectric layer and the second dielectric layer in a first mesa region between the first trench electrode and the second trench electrode, and forms a pn-junction with the drift region, wherein from the first trench electrode and the second trench electrode at least the first trench electrode is connected to the gate node, and wherein the source region and the body region are arranged in a second mesa region different from the first mesa region, wherein the second mesa region is adjacent the first trench electrode.

Example 15. The transistor device of example 14, wherein at least one of the transistor cells further comprises a source region and a body region in the first mesa region.

Example 16. The transistor device of example 14 or 15, wherein the compensation region is connected to the source node.

The invention claimed is:

1. A transistor device, comprising:
a semiconductor body;
a drift region in the semiconductor body;
a plurality of transistor cells;
a plurality of second mesa regions each arranged between two neighboring transistor cells and adjoining a first surface of the semiconductor body, wherein at least one of the plurality of second mesa regions comprises a section of the drift region that extends to the first surface;
a gate node; and
a source node;
wherein each of the plurality of transistor cells comprises:
a first trench electrode insulated from the semiconductor body by a first dielectric layer, and connected to the gate node or the source node;
a second trench electrode insulated from the semiconductor body by a second dielectric layer, and connected to the gate node, the source node or is floating;
a source region and a body region in a first mesa region between the first trench electrode and the second trench electrode; and
a compensation region,
wherein the compensation region adjoins the body region, the first dielectric, and the second dielectric, and forms a pn-junction with the drift region,
wherein the plurality of transistor cells comprises a transistor cell type in which the first trench electrode is connected to the source node and the second trench electrode is connected to the source node.

2. The transistor device of claim 1, wherein the plurality of transistor cells comprises another transistor cell type in which the first trench electrode is connected to the gate node and the second trench electrode is connected to the gate node.

3. The transistor device of claim 1, wherein the plurality of transistor cells comprises another transistor cell type in which the first trench electrode is connected to the gate node and the second trench electrode is connected to the source node.

4. The transistor device of claim 1, wherein at least one of the plurality of second mesa regions comprises a doped region that forms a pn-junction with the drift region.

5. The transistor device of claim 1, further comprising:
a Schottky contact formed between the source node and the drift region in at least one of the second mesa regions.

6. The transistor device of claim 1, further comprising:
a bias node different from the source node,
wherein the bias node is connected to the drift region in the plurality of second mesa regions.

7. The transistor device of claim 1, further comprising:
a drain region connected to a drain node or forming a drain node of the transistor device.

8. The transistor device of claim 1, wherein at least the first dielectric layer comprises a rounded corner in a region where the first dielectric layer adjoins the compensation region.

9. The transistor device of claim 8, wherein an inner radius of the rounded corner is between 0.5 times and 3 times of a thickness of the first dielectric layer.

10. An electronic circuit, comprising:
the transistor device of claim 6; and
an electronic switch and a bias voltage source connected in series between the source node and the bias node.

11. A transistor device, comprising:
a semiconductor body;
a drift region in the semiconductor body;
a plurality of transistor cells;
a plurality of second mesa regions each arranged between two neighboring transistor cells and adjoining a first surface of the semiconductor body, wherein at least one of the plurality of second mesa regions comprises a section of the drift region that extends to the first surface;
a gate node; and
a source node;

wherein each of the plurality of transistor cells comprises:
- a first trench electrode insulated from the semiconductor body by a first dielectric layer, and connected to the gate node or the source node;
- a second trench electrode insulated from the semiconductor body by a second dielectric layer, and connected to the gate node, the source node or is floating;
- a source region and a body region in a first mesa region between the first trench electrode and the second trench electrode; and
- a compensation region,
- wherein the compensation region adjoins the body region, the first dielectric, and the second dielectric, and forms a pn-junction with the drift region,
- wherein the plurality of transistor cells comprises a transistor cell type in which the first trench electrode is connected to the gate node and the second trench electrode is connected to the source node.

12. The transistor device of claim 11, wherein at least one of the plurality of second mesa regions comprises a doped region that forms a pn-junction with the drift region.

13. The transistor device of claim 11, further comprising:
a Schottky contact formed between the source node and the drift region in at least one of the second mesa regions.

14. The transistor device of claim 11, further comprising:
a bias node different from the source node,
wherein the bias node is connected to the drift region in the plurality of second mesa regions.

\* \* \* \* \*